United States Patent
Bergmann

(10) Patent No.: US 7,800,463 B2
(45) Date of Patent: Sep. 21, 2010

(54) BAND PASS FILTER

(75) Inventor: Andreas Bergmann, Haiming (DE)

(73) Assignee: Epcos AG, Munich (DE)

( * ) Notice: Subject to any disclaimer, the term of this patent is extended or adjusted under 35 U.S.C. 154(b) by 245 days.

(21) Appl. No.: 11/817,564

(22) PCT Filed: Jan. 4, 2006

(86) PCT No.: PCT/EP2006/000037

§ 371 (c)(1),
(2), (4) Date: Jan. 17, 2008

(87) PCT Pub. No.: WO2006/092184

PCT Pub. Date: Sep. 8, 2006

(65) Prior Publication Data

US 2009/0167462 A1  Jul. 2, 2009

(30) Foreign Application Priority Data

Mar. 1, 2005 (DE) .................. 10 2005 009 359

(51) Int. Cl.
*H03H 9/145* (2006.01)
*H03H 9/64* (2006.01)

(52) U.S. Cl. .................. 333/193; 310/313 B

(58) Field of Classification Search ............ 333/193, 333/195; 310/313 B
See application file for complete search history.

(56) References Cited

U.S. PATENT DOCUMENTS

| 4,908,542 | A | * | 3/1990 | Solie | ............ 310/313 B |
| 4,973,875 | A | * | 11/1990 | Yatsuda | ............ 310/313 D |
| 5,289,073 | A | | 2/1994 | Mariani | |
| 5,831,492 | A | | 11/1998 | Solie | |
| 5,896,072 | A | | 4/1999 | Bergmann et al. | |
| 6,313,715 | B1 | | 11/2001 | Bergmann et al. | |
| 6,351,197 | B1 | * | 2/2002 | Selmeier et al. | ............ 333/195 |
| 6,777,855 | B2 | | 8/2004 | Bergmann et al. | |
| 6,853,113 | B2 | | 2/2005 | Bergmann | |
| 6,856,214 | B2 | | 2/2005 | Jian et al. | |
| 6,909,342 | B2 | | 6/2005 | Bergmann et al. | |

(Continued)

FOREIGN PATENT DOCUMENTS

DE           38 38 923           6/1989

(Continued)

OTHER PUBLICATIONS

International Search report for PCT/EP2006/000037, Apr. 25, 2006.

(Continued)

*Primary Examiner*—Robert Pascal
*Assistant Examiner*—Alan Wong
(74) *Attorney, Agent, or Firm*—Fish & Richardson P.C.

(57) ABSTRACT

A band pass filter includes partial filters, each of which has a pass band. Pass bands of different ones of the partial filters have center frequencies that are different. A partial filter with a lowest center frequency has a pass band with a first low-frequency edge and a first high-frequency edge. The first low-frequency edge is steeper than first high-frequency edge. A partial filter with a highest center frequency has a pass band with a second low-frequency edge and a second high-frequency edge. The second high-frequency edge is steeper than the second low-frequency edge.

14 Claims, 7 Drawing Sheets

U.S. PATENT DOCUMENTS

| | | |
|---|---|---|
| 6,992,547 B2 | 1/2006 | Bergmann et al. |
| 7,538,637 B2 | 5/2009 | Mayer et al. |
| 2003/0057805 A1 | 3/2003 | Bergmann et al. |
| 2003/0122449 A1 | 7/2003 | Bergmann |
| 2004/0041666 A1 | 3/2004 | Bergmann et al. |
| 2004/0246076 A1 | 12/2004 | Bergmann |
| 2007/0018755 A1 | 1/2007 | Mayer et al. |
| 2008/0278031 A1 | 11/2008 | Bergmann et al. |
| 2008/0315972 A1 | 12/2008 | Mayer et al. |
| 2009/0167462 A1 | 7/2009 | Bergmann |

FOREIGN PATENT DOCUMENTS

| | | |
|---|---|---|
| DE | 103 14 153 | 10/2004 |
| EP | 0 850 510 | 3/2000 |
| GB | 2 252 214 | 7/1992 |
| JP | 2001-237666 | 8/2001 |
| WO | WO97/10646 | 3/1997 |
| WO | WO01/91293 | 11/2001 |

OTHER PUBLICATIONS

Written Opinion for PCT/EP2006/000037, Apr. 25, 2006.
Ivanov P. G. et al "Novel Structures for Low-Loss Slanted Filters" Ultrasonics Symposium, 2000 IEEE; vol. 1, Issue , Oct. 2000 pp. 113-116 vol. 1.
English translation of the Written Opinion for PCT/EP2006/000037.

* cited by examiner

BAND PASS FILTER

TECHNICAL FIELD

This patent application describes a band pass filter, an example of which is surface acoustic wave filter.

BACKGROUND

A broadband filter with an input and output transducer configured as FAN transducers is known from DE 3838923 A1. Additional filters with FAN transducers are known from EP 0850510 B1 and U.S. Pat. No. 5,289,073.

SUMMARY

Described herein is a broadband band pass filter with a high edge steepness.

The acoustic behavior of a transducer can be characterized (locally in the longitudinal direction) by weighting functions (excitation function or reflection function). The weighting functions depend on the longitudinal coordinate and describe the distribution of the excitation or reflection intensity in the transducer. The weighting functions of a transducer can be determined on the basis of electrical properties of the filter. From the calculated weighting function, one can infer the required sequence of connection and configuration of the electrode fingers.

The electrical behavior of a filter is generally defined by a transfer function (frequency response of the amplitude and phase of the transmitted signal). A characteristic of the transfer function is the steepness of the slope in the transition region of the pass band.

A band pass filter is described whose partial filters each have a pass band. The pass bands of different partial filters have different center frequencies. The pass band of the partial filter with the lowest center frequency has a low frequency (left-hand) edge, which is steeper than its high-frequency (right-hand) edge. The partial filter with the highest center frequency has a pass band whose high-frequency edge is steeper than its low-frequency edge.

The partial filters are electrically connected to each other.

The filter may be a surface acoustic wave filter having at least one acoustic track. In an embodiment, an input transducer and an output transducer are arranged in one acoustic track. The transducers each may have two busbars, to which the electrode fingers are connected. The electrode fingers connected to different electric potentials are interdigitated. This structure is arranged on a piezoelectric substrate and is used for the electroacoustic transformation of a (high-frequency) electronic signal into an acoustic wave and vice versa. In the input transducer, a surface wave is excited by an electronic input signal. This wave is transformed into an electronic output signal in the output transducer.

The acoustic track of a transducer is oriented along a longitudinal or lengthwise direction. In an embodiment, the lengthwise direction coincides with the direction of wave propagation.

The acoustic track can be subdivided in the transverse direction into partial tracks. Each partial track receives an imaginary ordering number $1 \leq i \leq N$, depending on its sequence. At least two of the partial tracks have different phase weightings. These partial tracks are designated here as a first and second partial track.

Each partial filter may be assigned its own partial acoustic track. In this embodiment, the two transducers are each divided into partial transducers, each of which is arranged in one of the partial tracks. Thus, in one partial track there is arranged one partial transducer of the input transducer and, corresponding to this, one partial transducer of the output transducer.

The acoustic track or the respective transducer can be subdivided in the longitudinal direction into a number N of consecutive cells. Each cell receives an imaginary ordering number $1 \leq j \leq N$, depending on its sequence. The cells generally have a length basically equal to one wavelength at the center frequency of the filter or the partial track or an integer multiple of this wavelength. In describing the wave propagation, the cell length is also known as the distance to be covered by the traveling wave.

The cells can be chosen, in particular, from the class of SPUDT cells (Single Phase Unidirectional Transducers). The SPUDT cells each provide for a directional beaming of the acoustic wave in a preferred direction. The directional beaming comes about thanks to the constructive superpositioning of the excited and the reflected wave in one direction and destructive superpositioning of the excited and the reflected wave in the opposite direction.

A cell type is defined by the sequence of connection of electrode fingers of a cell. Furthermore, a cell type is defined by a sequence of narrow and broad electrode fingers. Several cell types may be provided in one transducer. A partial track can contain several cells of the same cell type, which can be arranged alongside each other or also between cells of at least one other cell type.

As it travels through a cell, a wave undergoes a phase rotation, which is proportional to the cell length, normalized to the wavelength. In one embodiment, partial tracks are each phase-weighted, i.e., they each have cells of different length. By phase weighting in a partial track is meant here that a wave with a wavelength corresponding to the center frequency undergoes different phase rotations as it travels through different cells of the partial track.

Thanks to the phase weighting, a weighting of excitation and reflection also occurs, since the position of centers of excitation and reflection now deviates from a strictly periodic lattice for cells of different length.

The electrode fingers of a conventional transducer are arranged on a periodic lattice. In one embodiment, the transducer is configured as a FAN transducer. A FAN transducer usually has electrode fingers spread out in the shape of a fan. For a FAN transducer, the periodicity of the electrode fingers in the transverse direction varies from one partial track to another and, thus, so does the center frequency of partial tracks. Therefore, each partial track corresponds to its own wavelength/center frequency. The electrode fingers narrow in one transverse direction, and the finger period and the associated wavelength decreases.

The superpositioning of transfer functions of the individual partial tracks leads to a broadband filter characteristic. The bandwidth of the filter depends on the maximum difference of the center frequencies of the partial tracks. The edge steepness of the filter characteristic is especially determined by the edge steepness of the transfer function of the partial tracks with the lowest and the highest center frequency. The edge steepness and/or the selection of a partial track in a FAN transducer can be increased by a suitable phase weighting of individual cells within a partial acoustic track and especially by different weighting functions of different partial tracks of an acoustic track.

In known filters with FAN transducers, a higher edge steepness of the pass band was usually achieved by the lengthening of FAN transducers. Thanks to the phase weighting described here, it is possible to obtain a band pass filter with high edge steepness even with a rather short transducer length.

Thanks to the phase weighting, partial signals of different partial tracks that are superimposed on each other at certain frequencies can be canceled out. In this way, the selection of the filter in especially critical regions of unwanted maxima can be specifically improved. This applies, in particular, to nearby stop bands.

The phase weighting can also be used to realize FAN filters with lower insertion loss. A low insertion loss requires a high coupling factor of the substrate material. But, these materials usually have a high temperature coefficient. The phase weighting makes it possible, without changing the length of the component, to increase the edge steepness to the extent that the specification is observed in this point, despite increased temperature drift, and the insertion loss can be decreased by the larger coupling factor.

In one embodiment, two identical cells can be scaled relative to each other in the longitudinal direction, and the geometry of one cell can be changed into that of the other by compression or expansion. In another embodiment, two identical cells have finger groups of basically the same structure, but different distances between the last finger of the group and the finger facing it from the next group.

A "normal" cell has a length such that a wave with a wavelength corresponding to the center frequency of the partial track undergoes a phase rotation $\phi=2\pi n$ as it travels through this cell. If this wave in traveling through a cell undergoes a lesser phase rotation $\phi'=2\pi n-\Delta\phi<\phi$, where $0<\Delta\phi<\pi/2$, this cell is known as compressed. If this wave upon traveling through a cell undergoes a greater phase rotation $\phi'=2\pi n+\Delta\phi>\phi$, where $0<\Delta\phi<\pi/2$, this cell is known as expanded.

The distribution $\phi(x)$ of the phase rotation $\phi$ achieved per cell in a partial track along the longitudinal direction x may be different for two different partial tracks. The distribution $\phi(x)$ of a partial track may not be symmetrical.

In a filter with an input and output transducer, both transducers may be phase-weighted as described above.

The transducer can be configured as a FAN transducer with a rectangular layout, wherein the absolute longitudinal length of all partial tracks is essentially constant, but the length of the partial track with a higher center frequency, measured in wavelengths, is larger than the length of the partial track with a lower center frequency, measured in wavelengths.

The transducer can be divided into partial transducers in the longitudinal direction. Several partial transducers of a transducer, arranged alongside each other in the longitudinal direction, i.e., within the very same acoustic track, can be serially interconnected. Such a circuit is known among experts as a V-split. In this regard, we refer to the entire contents of publication WO 97/10646.

A transducer can comprise a parallel circuit of several serially interconnected partial transducers within an acoustic track.

The transducer can be divided into partial transducers of different length, which are serially interconnected. The excitation can be adjusted in a transducer by the phase weighting of such a transducer.

Moreover, the band pass filter can comprise FAN transducers connected in a two-track reflector filter. The FAN transducers can be connected, in particular, into a Z-path filter.

The FAN transducers in one embodiment can be connected into a multitransducer filter with a number of transducers $n\geq 3$, with the input and output transducers arranged alternatingly. The input transducers are connected in parallel with each other and to an input gate. The output transducers are also connected in parallel with each other and to an output gate.

The finger edges of a FAN transducer are generally not parallel to each other. The focus of a FAN transducer is the term for the point where imaginary lines, representing the extension of finger edges of the transducer, intersect.

The band pass filter can also contain several FAN transducer having the same focus arranged in one track. Alternatively, the band pass filter can comprise a transducer arrangement of several FAN transducers arranged in one track, each transducer having its own and unique focus.

The band pass filter can contain several of the described transducers and, furthermore, at least one additional transducer.

Besides the described FAN transducers, the band pass filter can contain at least one additional transducer which is not a FAN transducer, i.e., which has parallel finger edges.

The band pass filter can contain, in addition to at least one first transducer as described, a second transducer, with the first and second transducers arranged in an acoustic track, and a metal structure (shielding bar) between the first and the second transducer inside the acoustic track. Such a metal structure serves, e.g., to shield out electromagnetic crosstalk and to match up the various signal travel times in the individual partial tracks into which the acoustic track is subdivided.

Hereafter, the filter will be explained in greater detail by examples and the accompanying figures. The figures are not true to scale. The same or equivalent parts are given the same reference numbers.

DETAILED DESCRIPTION

Figure 1:
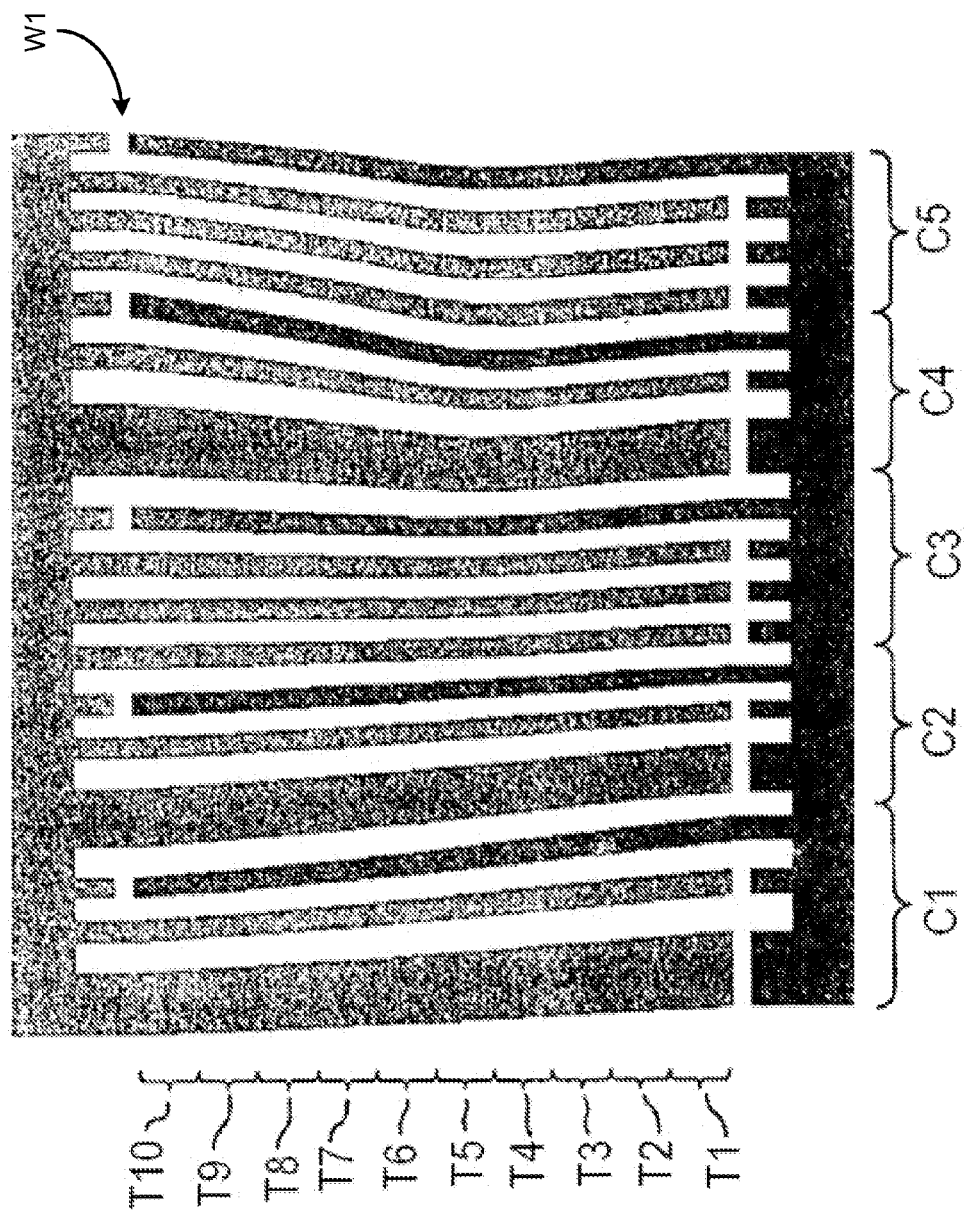
FIG. 1, a segment in schematic top view of a FAN transducer with partial tracks having different phase weighting.

FIG. 1 shows a segment in schematic view of a transducer W1 to be used in the broadband filter, having an acoustic track divided in the transverse direction into ten partial tracks T1 to T10. A surface acoustic wave is excited in the acoustic track.

The excitation of a cell can take on a normalized value E between −1 and 1. The reflection of a cell can take on a normalized value R between −1 and 1. A transducer is characterized by an excitation function $E(x)$ and a reflection function $R(x)$, where x is the longitudinal direction, which may coincide with the direction of wave propagation.

The transducer W1 is subdivided in the longitudinal direction into N cells, of which five cells, C1 to C5, are shown. The cells C1, C2 and C4 belong to the first cell type with E=1, R=1, and cells C3 and C5 belong to the second cell type with E=1, R=0.

The partial tracks T1 to T10 have an identical sequence of cells. The partial tracks T1 to T10 have different center frequencies, with partial track T1 having the highest and T10 the lowest center frequency. The center frequency decreases with higher ordering number of the partial tracks.

Each partial track is phase-weighted, i.e., the consecutive cells are scaled with different scaling factors relative to the center frequency of the filter in the region of this partial track. The weighting function F(Cj) of a partial track, j=1 to N, is a function of the scaling factor F in dependence on the cell C1 to CN.

The partial tracks T1 to T10 of the transducer W1 are weighted with different weighting functions F(T1, Cj), with i=1 to M being the ordering number of the partial track and M the number of partial tracks. In FIG. 1, M=10.

In the table presented below, the weighting function F(Ti, Cj) is shown for 5 cells of the transducer subdivided into 10 partial tracks, according to FIG. 1.

TABLE

Scaling factors F(Ti, Cj) for the length of the cells C1 to C5 in the partial tracks T1 to T10.

|     | C1     | C2     | C3     | C4     | C5     |
| --- | ------ | ------ | ------ | ------ | ------ |
| T10 | 1.0503 | 1.0404 | 1.0364 | 1.2313 | 0.8718 |
| T9  | 1.0771 | 1.0178 | 1.0030 | 1.1679 | 0.9047 |
| T8  | 1.1037 | 0.9954 | 0.9699 | 1.1050 | 0.9373 |
| T7  | 1.1300 | 0.9732 | 0.9371 | 1.0426 | 0.9695 |
| T6  | 1.1560 | 0.9511 | 0.9045 | 0.9808 | 1.0015 |
| T5  | 1.1803 | 0.9306 | 0.8930 | 0.9515 | 1.0142 |
| T4  | 1.2027 | 0.9118 | 0.9023 | 0.9545 | 1.0078 |
| T3  | 1.2249 | 0.8932 | 0.9116 | 0.9575 | 1.0014 |
| T2  | 1.2470 | 0.8746 | 0.9207 | 0.9604 | 0.9951 |
| T1  | 1.2688 | 0.8562 | 0.9298 | 0.9632 | 0.9888 |

The values are related to the length of a reference cell, corresponding to the center frequency $f_0 = 594$ MHz of the filter.

The scaling factor F(Ti, Cj)>1 corresponds to an expansion of the particular cell with ordering number j in the region of the partial track with ordering number i relative to a reference cell, whose center frequency agrees with the center frequency of the filter. The scaling factor F(Ti, Cj)<1 corresponds to a cell which is compressed relative to the reference cell.

The cells within a partial track are scaled with different scaling factor; i.e., the cells have different cell lengths from each other. For example, in the first partial track T1, the first cell C1 is expanded the most and the second cell C2 compressed the most. In the sixth partial track T6, the first cell C1 is expanded the most and the third cell C3 compressed the most. In the tenth partial track T10, the fourth cell C4 is expanded the most and the fifth cell C5 compressed the most.

Figure 2:
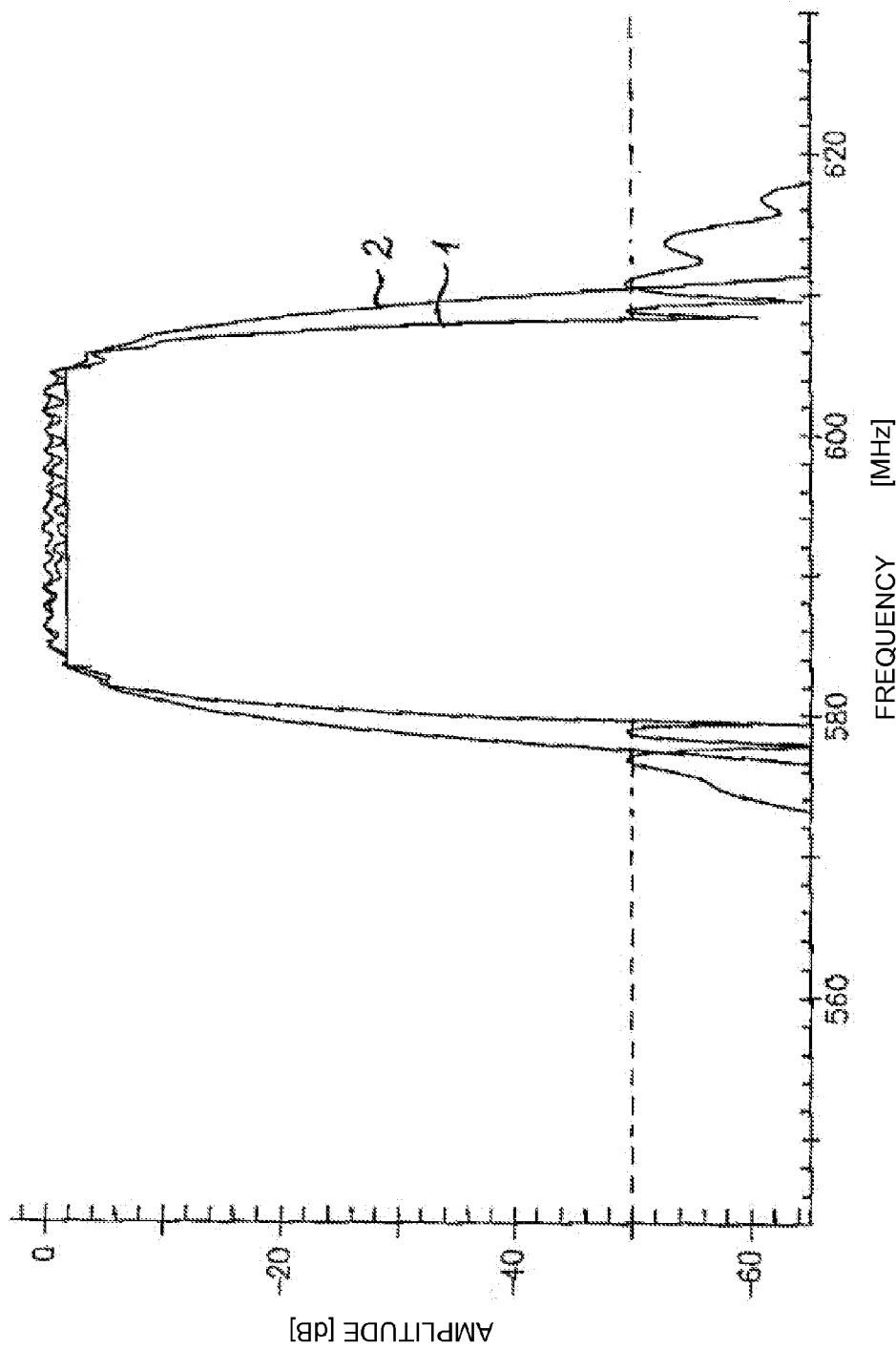
FIG. 2, transfer function of the filter with a FAN transducer according to FIG. 1, contrasted with a transfer function of a known filter.

FIG. 2 shows a transfer function 1 (scatter parameter $|S_{21}|$) of the filter with the phase-weighted transducer according to FIG. 1 as compared to the transfer function 2 (scatter parameter $|S_{21}|$) of a filter with the same center frequency, but whose transducer is not phase-weighted. The pass band of the former filter has a greater edge steepness for the same bandwidth. The new degrees of freedom made possible by the phase weighting can also be utilized to improve selection.

The filter with conventional transducers and the filter with the phase-weighted transducers, other than the phase weighting of the partial tracks, have the same parameters, such as transducer length, aperture, electrode finger layer thickness, SPUDT cells sequence, and center frequency.

Figure 3:
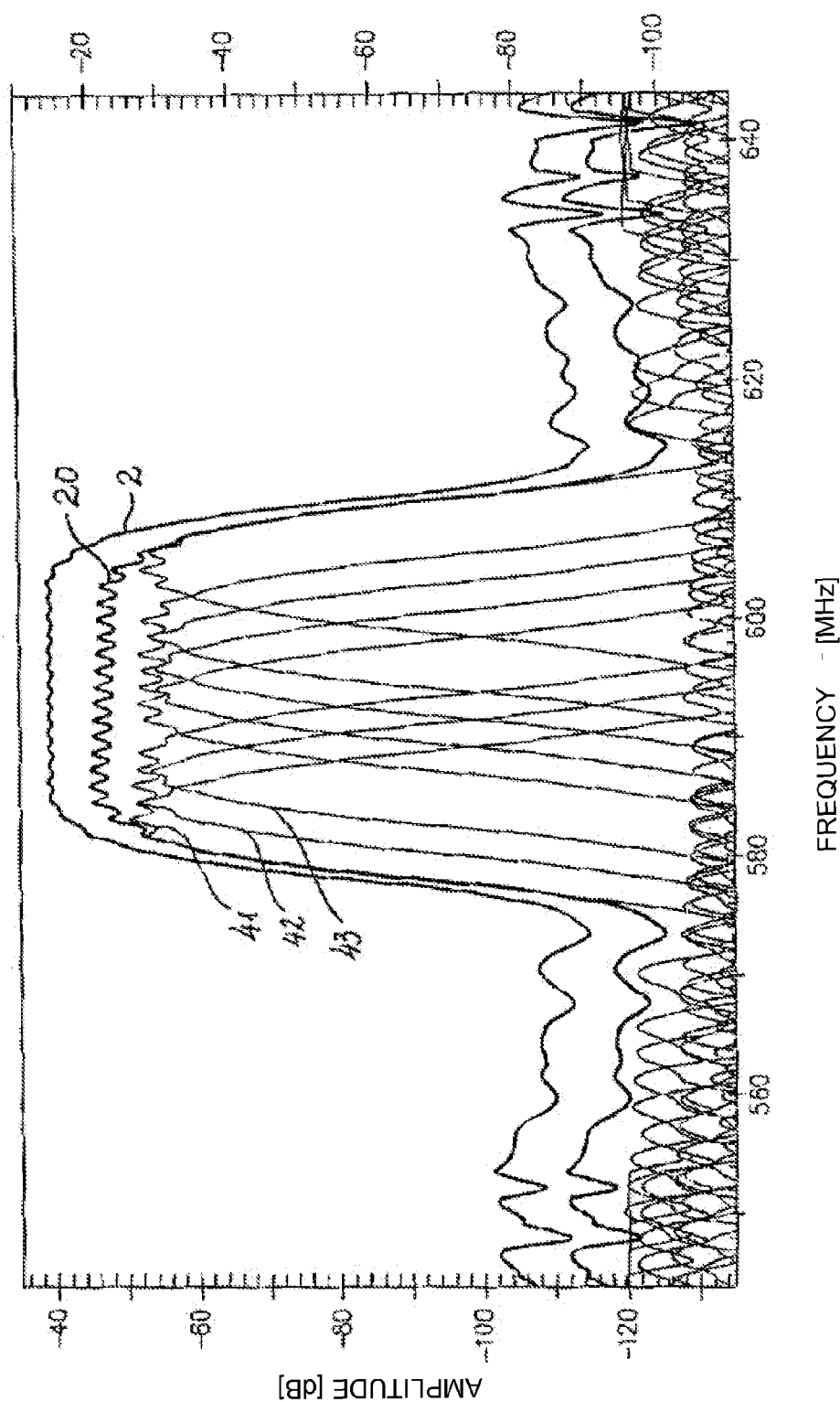
FIG. 3, admittance curves of the partial tracks and the admittance curve and the transfer function of a filter with conventional transducers.

FIG. 3 shows admittance curves 41, 42, 43 (transfer admittance $|Y_{21}|$) of individual partial tracks of the filter with conventional transducers, as well as the transfer function 2 ($|S_{21}|$) and the admittance curve 20 ($|Y_{21}|$) of this filter. The left-hand scale in FIGS. 3 and 4 shows the values of the amplitude of admittance curves $|S_{21}|$ and the right-hand scale the values of the amplitude of $|S_{21}|$ under electrical matching.

The admittance curves 41, 42, 43 each have basically equally steep left and right edges, which are approximately symmetrical in relation to the center frequency of the respective pass band.

Figure 4:
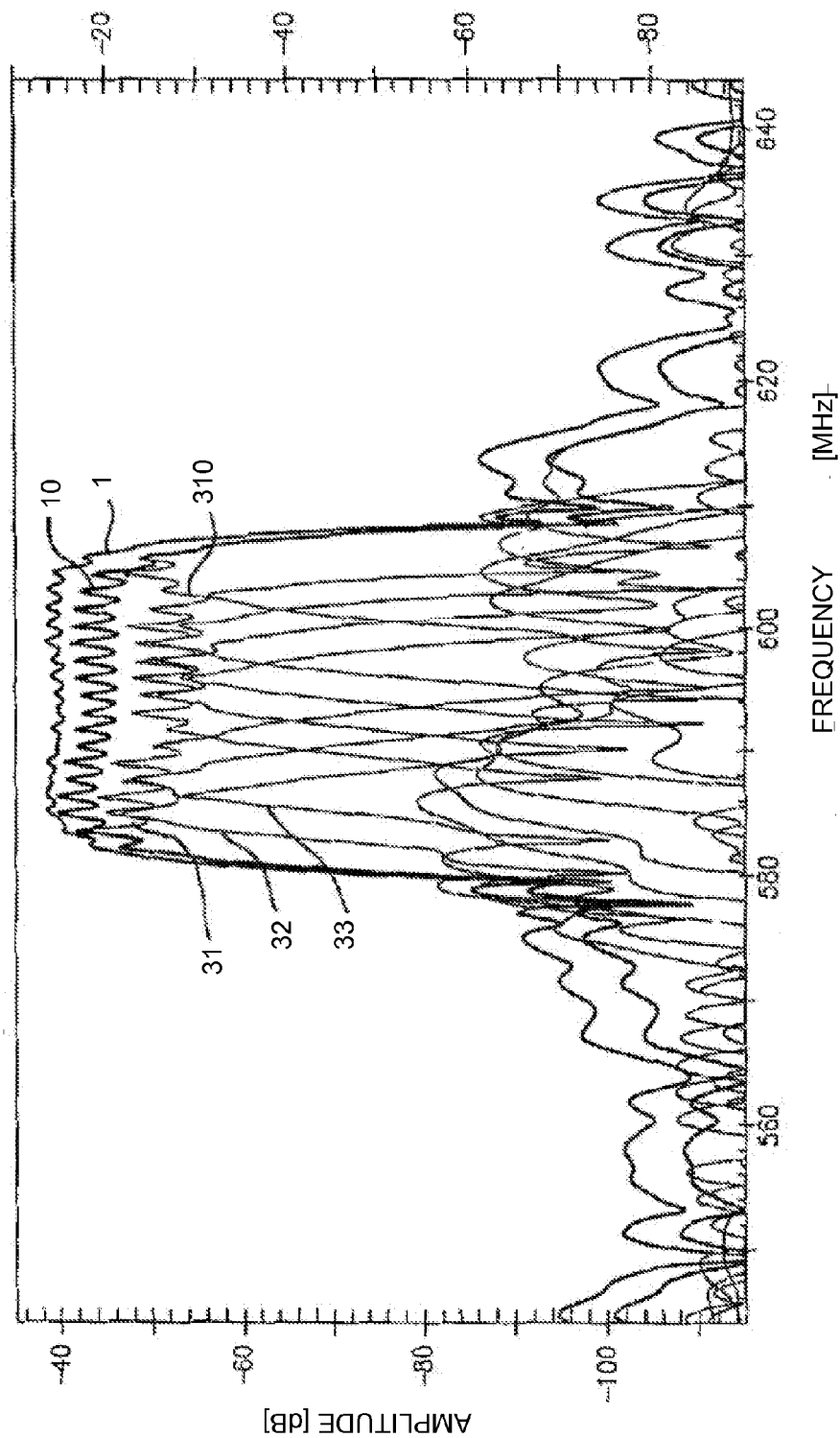
FIG. 4, admittance curves of the partial tracks and the admittance curve and the transfer function of a filter with transducers according to FIG. 1.

FIG. 4 shows admittance curves 31, 32, 33, 310 (transfer admittance $Y_{21}$) of individual partial tracks T1 to T10 of the filter with the transducer according to an embodiment, one segment of which is shown schematically in FIG. 1, as well as its transfer function 1 ($|S_{21}|$) and the admittance curve 10 ($|Y_{21}|$). Curve 31 corresponds to partial track T10, curves 32 and 33 to partial tracks T9 and T8. Curve 310 corresponds to partial track T1.

The admittance curves 31, 310 of the partial track with the lowest and highest center frequency, respectively, are not symmetrical relative to the center frequency of the particular partial track. The admittance curve 31 of the partial track with the lowest center frequency has an especially steep left edge, which determines the steepness of the left edge of the filter. The admittance curve 310 of the partial track with the highest center frequency has an especially steep right edge, which determines the steepness of the right edge of the filter. The steepness of the steeper edge each time has been achieved by a corresponding phase weighting of the partial track at the expense of the other edge.

The partial tracks whose center frequencies lie not far from the center frequency of the filter, on the other hand, are configured so that their transfer functions (admittance curves) are essentially symmetrical.

Figure 5:
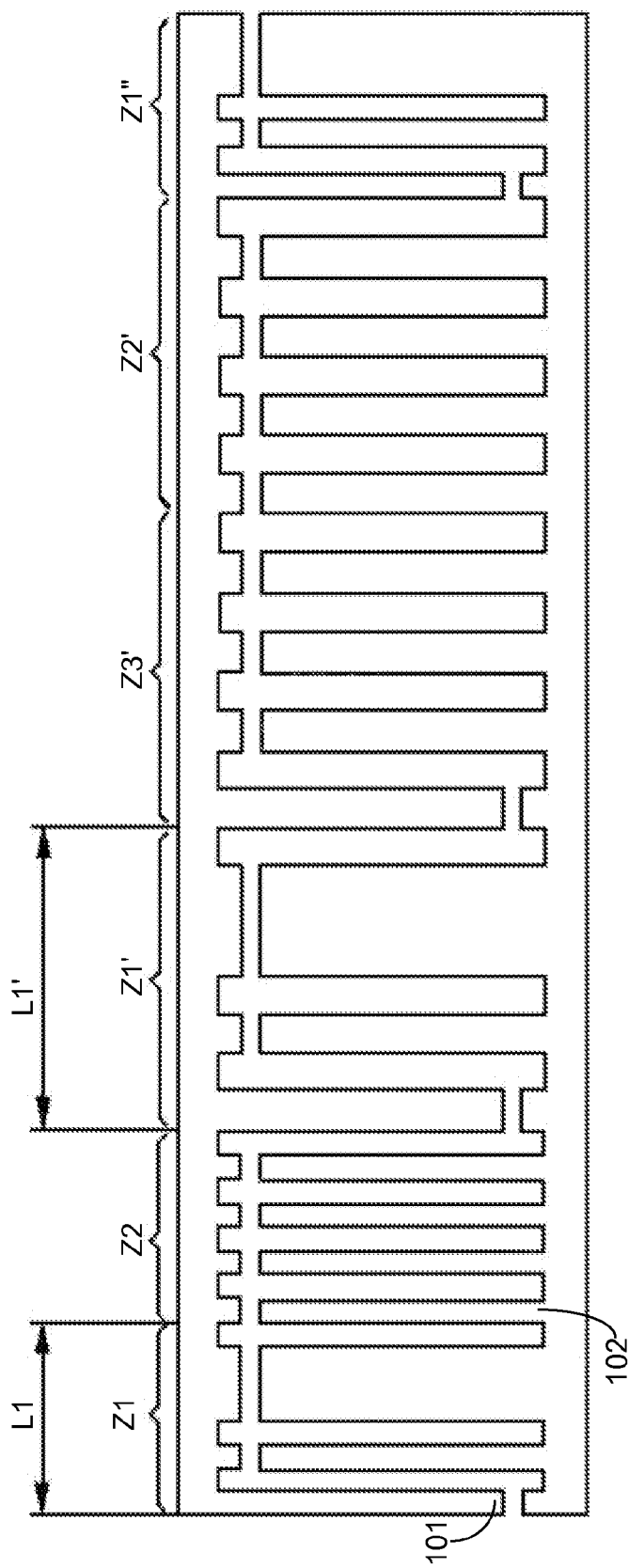
FIG. 5, the scaling of cells in a transducer.
Figure 6:
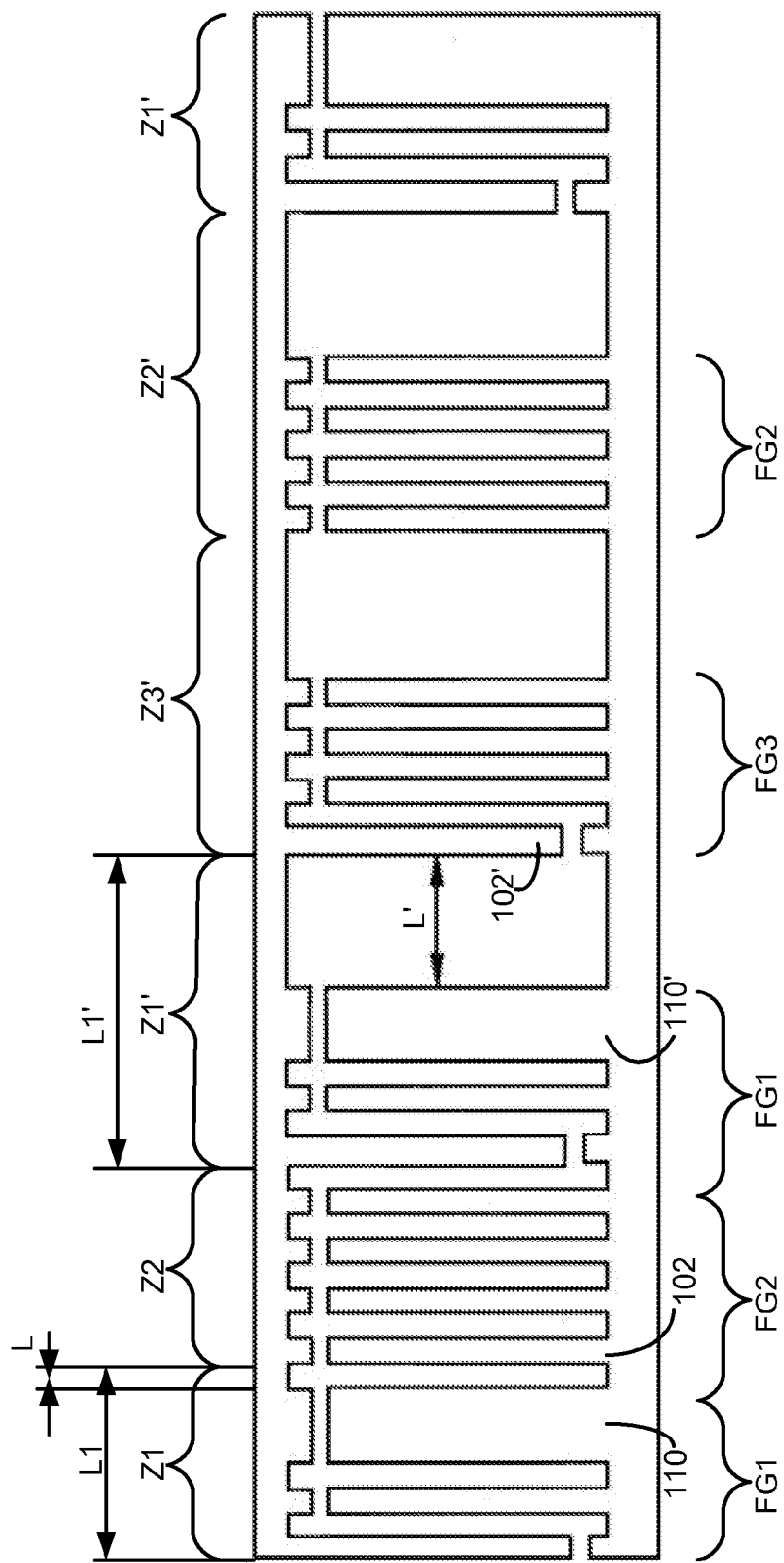
FIG. 6, a sequence of cells, having cells of different length with identical finger groups.

FIGS. 5 and 6 each show schematically a segment of a transducer with an acoustic track which is subdivided in the longitudinal direction into cells Z1, Z2, Z1', Z3', Z2', Z1". The description of the acoustic track shown in these figures also applies to the partial tracks of a FAN transducer.

The cells Z1 and Z2 are different in configuration, but matched to the same frequency—the center frequency of the acoustic track. The cells Z1', Z2' and Z3' are phase-weighted cells.

In the example of FIG. 5, the cells Z1 and Z1' of a first cell type have a similar geometry and can merge into each other by an appropriate scaling in the longitudinal direction. The absolute length L1 of the cell Z1, measured from the left edge of the first finger 101 of this cell to the left edge of the first finger 102 of the next cell Z2, is different from the length L1' of the scaled cell Z1', so that in passing through the two cells, the acoustic wave covers different travel distances and consequently also undergoes different phase rotations. In this way, one can conveniently adjust the initial phase with which the wave arrives at the beginning of the next cell (Z2 or Z3).

Z1", which also belongs to the first cell type, is not scaled relative to the cell Z1.

Cells Z2 and Z2' are the cells of a second cell type and, like the cells of the first cell type, they are scaled relative to each other; the degree of scaling can be chosen to be the same or different for different cell types.

Cells Z1 and Z1' have both reflective and excitatory action. Cells Z2 and Z2' are neither excitatory nor reflective.

In the embodiment according to FIG. 6, the cells Z1, Z1" and Z2 matched to the center frequency of the acoustic track and the phase-weighted cells Z1', Z2' and Z3' each have a single electrode finger group FG1, FG2 and FG3, which comprises all electrode fingers of the particular cell.

The cells Z1 and Z1' of the first cell type have, in this embodiment, electrode finger groups FG1 of identical construction.

The cells Z1 and Z1' here are of different length. The different cell lengths in the functional cells of the same cell type is achieved in that the distance L between the last finger 110 of the finger group FG1 of the particular functional cell Z1 and the first finger 111 of the next cell Z2 differs from the distance L' between the last finger 110' of the finger group FG1 of the modified functional cell Z1' and the first finger 111' of the cell Z3.

Similarly, the cells Z2 and Z2' of the second cell type each have identically structured electrode finger groups FG2. The cell Z2' is modified relative to the cell Z2 as just described.

Figure 7:
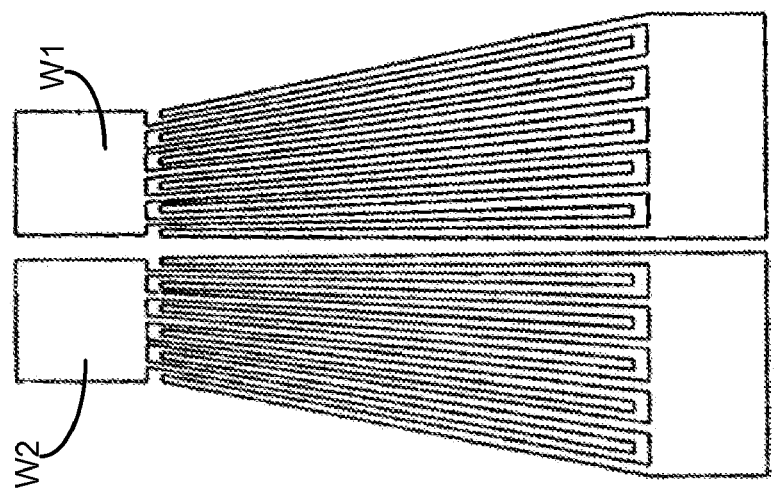
FIG. 7, a filter with one input and one output transducer configured as FAN transducers.

FIG. 7 shows in schematic top view a filter with an input and an output transducer W1, W2, each configured as FAN transducers, for example, as transducers according to FIG. 1. The acoustic wave generated in the input transducer W1 is may be beamed in the direction of the output transducer W2 by an appropriately chosen arrangement of SPUDT cells of this transducer.

In heretofore familiar FAN transducers, the distribution of excitation and reflection centers (related to the center frequency and thus to the wavelength of the particular partial track) is the same from one partial track to another. The finger sequence of one partial track can be converted into the finger sequence of another partial track of the same FAN transducer by a similarity transform, such as expansion or compression, in the longitudinal direction. The consecutive cells in a partial track of a familiar FAN transducer have a length resulting in the same phase rotation of the wave as it passes through each cell.

Thanks to the above explained phase weighting of the partial tracks, the distribution of excitation and reflection centers in a FAN transducer is adjusted to be different from one partial track to another. Although the cell sequence may be the same from one partial track to another, the consecutive cells in one partial track have lengths differing from each other. Furthermore, the partial tracks have phase weightings that may be different from each other; in particular, the partial tracks with the lowest and highest center frequency are weighted differently from the other partial tracks.

The transducers W1 and W2 can differ from each other in the lengths or number of cells in the acoustic track. The phase weighting of the corresponding partial tracks may be different in the two transducers. When optimizing the transducer geometry, the length of each cell in each partial track is optimized independently of other cells of the same partial track.

The filter described here satisfies high demands on bandwidth, edge steepness and selection.

The filter is not limited to the examples shown. Besides the cell types shown in FIG. 1, other cell types are also conceivable. These may be cell types classified as SPUDT cells.

The finger edges of a FAN transducer generally deviate from the transverse direction, i.e., they are not perpendicular to the direction of wave propagation.

An acoustic track can basically be subdivided into any given number of partial tracks. It makes sense to divide it such that one can assume that finger edges run essentially in the transverse direction within a partial track.

Finger edges of a partial track can run perpendicular to the direction of wave propagation in one embodiment, in which case the electrode fingers have steps at the transition between the partial tracks.

In one embodiment, the partial tracks with the lowest and highest center frequency in the transducer are arranged in end position. But in one embodiment the transducer can also have electrode fingers which are curved so that the partial track with the highest center frequency is arranged at the center of the transducer.

Besides the described phase weighting, it is possible to alter the sequence of narrow and broad fingers from one partial track to another in the FAN transducer.

Figure 8:
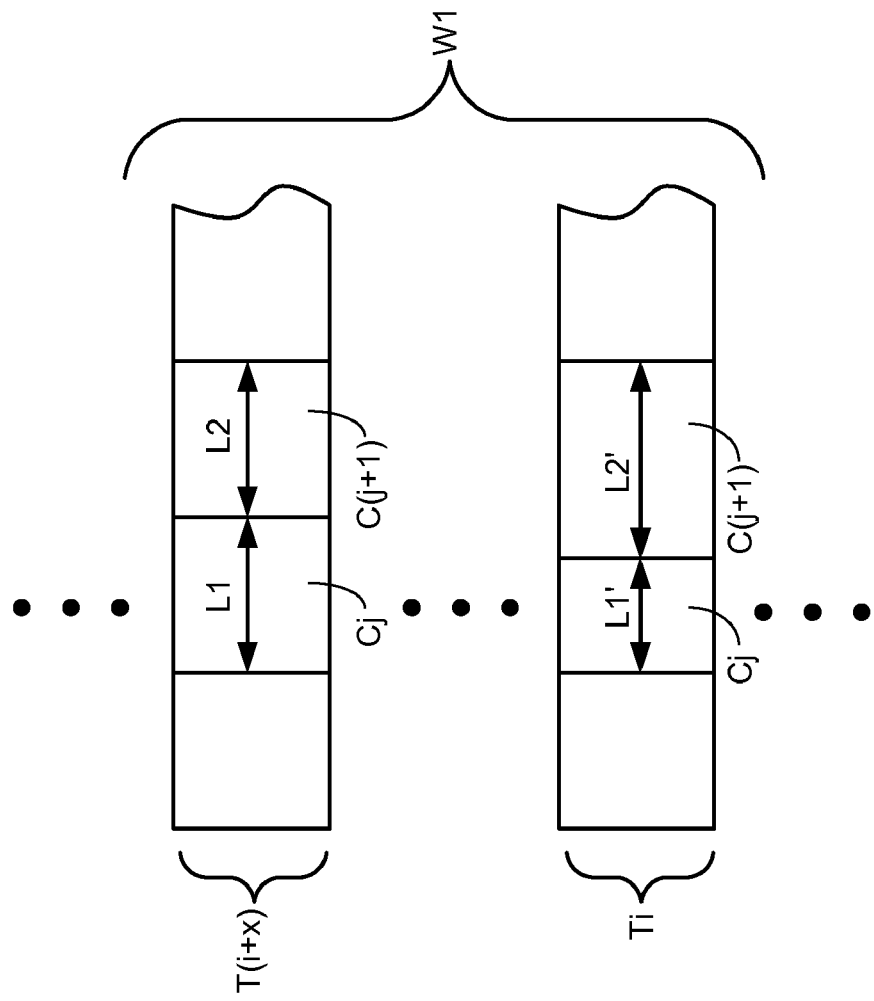
FIG. 8, the scaling of cells in two arbitrarily selected partial tracks of a transducer.

To explain the phase weighting, FIG. 8 shows schematically a segment of a transducer W1 with two arbitrarily selected partial tracks Ti and T(i+x). Ti is a first partial track and T(i+x) a second partial track in the sense of this patent. The indices i and (i+x) refer to the ordering number of the partial track.

Cj and C(j+1) are cells with ordering number j and (j+1). The cell Cj, arranged in the partial track T(i+x), and its corresponding cell Cj with the same ordering number, arranged in the partial track Ti, may belong to the same cell type. This also holds for the corresponding cells C(j+1) with the ordering number (j+1), while the cells Cj and C(j+1) in one embodiment belong to different cell types and in another embodiment they belong to the same cell type.

The cell Cj arranged in the partial track T(i+x) has a length L1, and its corresponding cell Cj with the same ordering number, arranged in the partial track Ti, has a length L1'. The cell C(j+1) arranged in the partial track T(i+x) has a length L2, and the corresponding cell C(j+1) with the same ordering number, arranged in the partial track Ti, has a length L2'. The ratio of the cell lengths a1=L1/L1' differs from the ratio of cell lengths a2=L2/L2'. In this example, a1>1 and a2<1.

What is claimed is:

1. A band pass filter comprising:
   partial filters, each of the partial filters having a pass band;
      wherein pass bands of different ones of the partial filters have center frequencies that are different;
      wherein a partial filter with a lowest center frequency has a pass band with a first low-frequency edge and a first high-frequency edge, the first low-frequency edge being steeper than the first high-frequency edge;
      wherein a partial filter with a highest center frequency has a pass band with a second low-frequency edge and a second high-frequency edge, the second high-frequency edge being steeper than the second low-frequency edge; and
      wherein the band pass filter comprises a surface acoustic wave filter; and
   a transducer having an acoustic track that is divided into partial tracks in a transverse direction;
      wherein each partial track forms one of the partial filters;
      wherein partial tracks are divided, in a longitudinal direction, into a number N of consecutive acoustic cells;
      wherein a partial track has acoustic cells of different cell types; and
      wherein acoustic cell type is defined by a sequence of electrode fingers of an acoustic cell.

2. The band pass filter of claim 1, wherein the transducer comprises electrode fingers having lengthwise edges that are at least partly slanted in a lengthwise direction.

3. The band pass filter of claim 1, wherein the transducer comprises electrode fingers having lengthwise edges with steps;
   wherein segments of lengthwise edges of the electrode fingers are perpendicular to a direction of wave propagation.

4. The band pass filter of claim 1, wherein the transducer comprises electrode fingers that are curved such that a partial track with a highest center frequency is in about a middle of the transducer.

5. The band pass filter of claim 1, wherein each acoustic cell has a distance measured from a start of a subject acoustic cell to a start of a next acoustic cell;
- wherein each acoustic cell is assigned a number $1 \leq j \leq N$ according to position in sequence;
- wherein, for at least one number $1 \leq j \leq N-1$, a ratio of distances of acoustic cells with number j in a first partial track and a second partial track is a1;
- wherein a ratio of distances of acoustic cells with number j+1 in a first partial track and a second partial track is a2; and
- wherein a2≠a1.

6. The band pass filter of claim 5, wherein a1>1 and a2<1, or wherein a1<1 and a2>1.

7. The band pass filter of claim 5, wherein a first acoustic cell of the second partial track is scaled by a factor F1 in a longitudinal direction relative to a first acoustic cell of the first partial track; and
- wherein a second acoustic cell of the second partial track is scaled by a factor F2≠F1 in the longitudinal direction relative to a second acoustic cell of the first partial track.

8. The band pass filter of claim 7, wherein F1>1 and F2<1, or wherein F1<1 and F2>1.

9. The band pass filter of claim 5, wherein acoustic cells with a same number $1 \leq j \leq N$ that are in different partial tracks have a same cell type.

10. The band pass filter of claim 5, wherein all electrode fingers of an acoustic cell form an electrode finger group;
- wherein acoustic cells with number j in the first partial track and the second partial track that are normalized to a wavelength at a center frequency of an acoustic track comprise electrode finger groups having substantially a same structure; and
- wherein, for an acoustic cell with ordering number j in the first partial track, there is a first distance between a final electrode finger of the acoustic cell and an electrode finger facing the final electrode finger from a next acoustic cell in the first partial track;
- wherein there is a second distance in the second partial track that corresponds to the first distance; and
- wherein the first distance and the second distance are different.

11. The band pass filter of claim 5, wherein the transducer comprises electrode fingers having lengthwise edges with steps;
- wherein segments of lengthwise edges of the electrode fingers are each perpendicular to a direction of wave propagation.

12. The band pass filter of claim 5, wherein the transducer comprises electrode fingers having lengthwise edges that are at least partly slanted in a lengthwise direction.

13. The band pass filter of claim 5, wherein the transducer comprises electrode fingers that are curved such that a partial track with a highest center frequency is in about a middle of the transducer.

14. The band pass filter of claim 1, wherein the transducer comprises electrode fingers having lengthwise edges with steps;
- wherein segments of lengthwise edges of the electrode fingers are perpendicular to a direction of wave propagation.

* * * * *